United States Patent [19]

Matsuura

[11] Patent Number: 5,774,219
[45] Date of Patent: Jun. 30, 1998

[54] REFLECTION-TYPE OPTICAL ENCODER WITH LIGHT RECEIVING ARRAY

[75] Inventor: Tatsuhiko Matsuura, Osaka, Japan

[73] Assignee: Mitutoyo Corporation, Kanagawa, Japan

[21] Appl. No.: 786,668

[22] Filed: Jan. 21, 1997

[30] Foreign Application Priority Data

Jan. 23, 1996 [JP] Japan .................................. 8-028596

[51] Int. Cl.⁶ .................................................. G01B 9/02
[52] U.S. Cl. ....................................... 356/356; 250/237 G
[58] Field of Search ................................ 356/345, 356, 356/363, 373; 250/237 G

[56] References Cited

U.S. PATENT DOCUMENTS 4,051,367  9/1977  Sayce et al. ............................ 250/237
5,067,816  11/1991  Ichikawa .................................. 356/373
5,657,125  8/1997  Kato et al. ............................... 356/356

Primary Examiner—David C. Nelms
Assistant Examiner—Robert Kim
Attorney, Agent, or Firm—Webb Ziesenheim Bruening Logsdon Orkin & Hanson, P.C.

[57] ABSTRACT

A reflection-type main scale G1 is disposed on a first member 10. A diffused light source 40, a transmission-type light source index scale G2, and a photodiode array PDA are disposed on a second member 20. The diffused light source 40 irradiates the main scale G1 through the index scale G2 for generating a reflected image pattern. The photodiode array PDA detects the reflected image pattern obtained from the main scale G1. The photodiode array PDA and the index scale G2 are integrally united in such a manner that the receiving surface of the photodiode array PDA and the grating surface of the index scale G2 are aligned in a plane.

13 Claims, 11 Drawing Sheets

F I G. 13
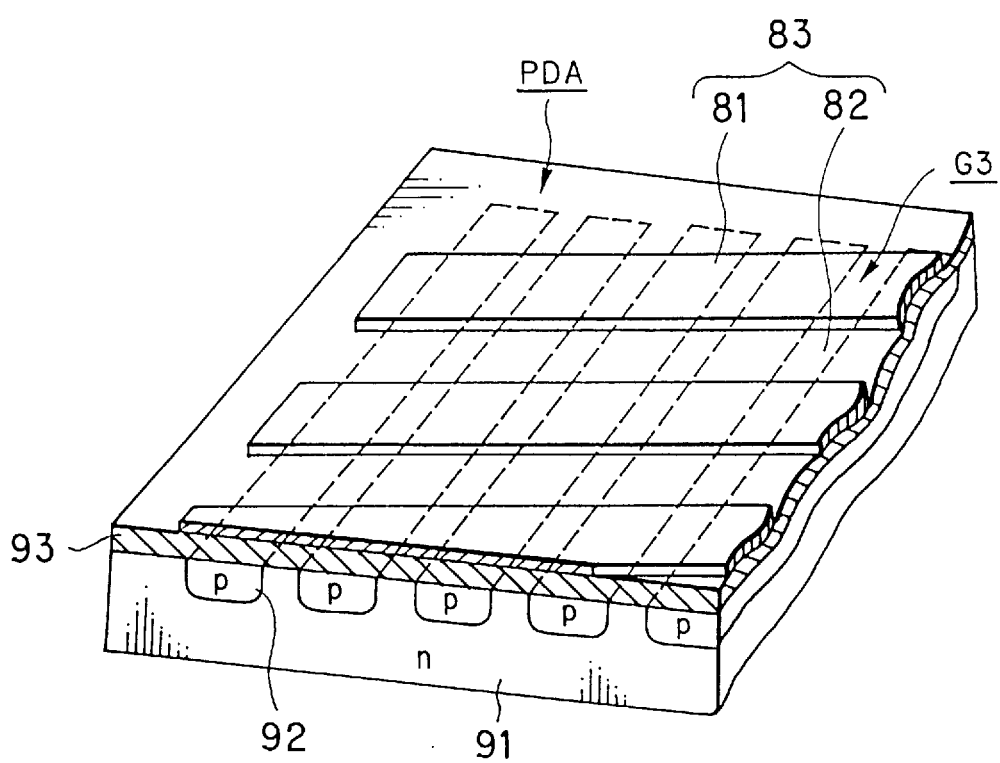

F I G. 16
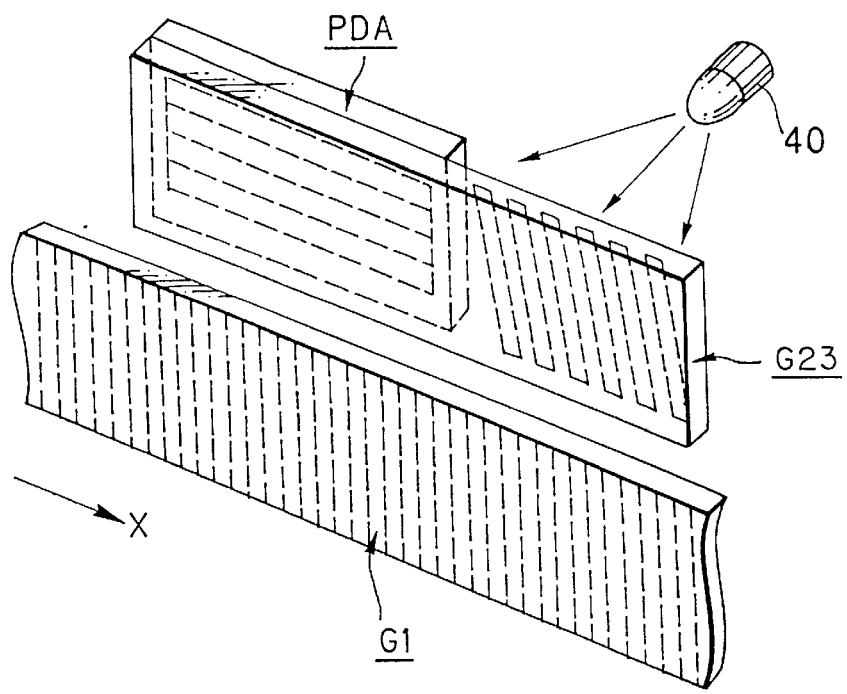
F I G. 17
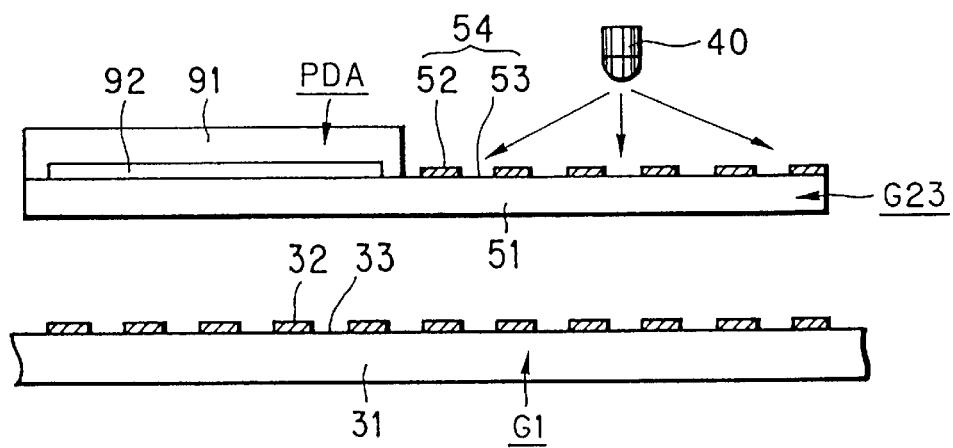

GEOMETRICAL SYSTEM

DIFFRACTIVE SYSTEM

REFLECTION-TYPE OPTICAL ENCODER WITH LIGHT RECEIVING ARRAY

BACKGROUND OF THE INVENTION (1). Field of the Invention

The present invention relates to an optical encoder for optically measuring a relative displacement of a first member and a second member relatively movably disposed at a predetermined gap, more especially relates to an reflection-type encoder with a modified three-grating system such that a light receiving device array serves as an index scale.

(2). Prior Art

An optical encoder that optically measure a relative displacement of two members detect the variation of a bright/dark pattern corresponding to the variation of the overlap of two gratings. The two gratings are formed on a main scale and an index scale at predetermined pitches. In the case that a collimated light is used for obtaining a bright/dark image of the main scale, when the scale pitches are finely formed, the influence of diffraction of light becomes large. Thus, the bright/dark image of the main scale cannot be clearly obtained.

On the other hand, an optical encoder that actively uses a pattern of a diffraction image has been proposed. In this encoder, a main scale is formed to have a grating pitch near a wave length of a light source, and a collimated light is radiated to the main scale. A bright/dark pattern corresponding to the scale pattern represents a peak value at such a gap position that ±1-st order diffracted light and 0-th order light (nondiffracted light) overlap. However, in this method, a clear bright/dark pattern cannot be obtained outside the predetermined gap position. Assuming that the grating pitch of the main scale is denoted by P and the wave length of the light source is denoted by $\xi$, the index scale should be precisely disposed at the position of $p^2/\xi$ (or a multiple thereof) spaced apart from the main scale. For example, assuming that the scale grating pitch P is 8 $\mu$m and the wave length of the light source $\xi$ is 700 nm, $P^2/\xi$ becomes 91.4 $\mu$m. It is difficult to accurately adjust such a small gap. Even if the index scale is accurately aligned, a small fluctuation of the gap largely deteriorates the S/N ratio.

To solve such a problem, a so-called three-grating system is known. In this system, a diffused light source is used, and index scales are disposed on the light source side and the light receiving side, whereby the variation of the overlap of the three gratings is used. For example, as shown in FIG. 18, a main scale 1, a light receiving side index scale 3, and a light source side index scale 2 are used. When the diffused light source such as a LED is used as the light source 4, the index scale 2 serves as a secondary light source array with a predetermined pitch P2. A bright/dark pattern of the main scale 1 corresponding to the radiation from the secondary light source array is modulated by the light receiving side index scale 3. Thus, an output signal that varies corresponding to the displacement of the scale is obtained by a light receiving device 5.

A three-grating system which is structured as a reflection-type as shown in FIG. 19, and the light source side index scale 2 and the light receiving side index scale 3 are shared, has been disclosed as for example Japanese Patent Examined Publication 60-23283. When the relation between the grating pitch of the main scale and the grating pitch of the index scale is set, this system can be treated as a system for detecting a geometric optical image pattern (hereinafter referred to as geometrical system). Alternatively, this system can be also treated as a system for obtaining a diffracted image pattern (hereinafter referred to as diffractive system).

FIGS. 20A and 20B show examples of scale gratings and image patterns of the geometrical system and the diffractive system. In the reflection-type, the gap distance between scales is u=v. In the geometrical system shown in FIG. 20A, assuming that the main scale pitch, light source side index scale pitch and light receiving side index scale pitch are P1, P2 and P3, respectively, when a relation of P2=P3=P1 is satisfied, a bright/dark pattern of which light components that straightly travel in the main scale overlap is obtained. In the diffractive system shown in FIG. 20B, in the relation of P2=P3=P1, a bright/dark pattern can be obtained, which 1st order diffracted light and 0-th order light overlap.

In the system disclosed as Japanese Patent Examined Publication 60-23282, as shown in FIG. 20, in the relation of P2=P3, the light source side index scale and the light receiving side index scale are shared. On the other hand, another reflection-type optical encoder using a three-grating system has been disclosed as for example Japanese Utility Model Registration Examined Publication 7-888. In this encoder, although a light source index scale and a light receiving index scale are formed on a common substrate, these index scales are disposed at different pitches from each other. With this system, the degree of freedom of designing gratings increases.

In a conventional reflection-type optical encoder using the three-grating system that has been proposed, to allow the light receiving side index scale to obtain two displacement output signals with different phases from each other, it is necessary to dispose two grating portions with spatial phases. In addition, to obtain 180° shifted displacement output signals from the above two displacement output signal, two more grating portions should be disposed. Thus, the displacement output signals tend to be affected by the distribution of light amount and the deviation of the scales. Thus, it is difficult to align the scale members. A slight mechanical rotation such as yawing, pitching, and rolling largely deteriorates the characteristic of the encoder.

In addition, a system using a light receiving device array that also functions as a light receiving side index scale may be considered. However, in this case, when the light source side index scale and the light receiving device array are mounted, alignment adjustments thereof are required. A slight adjustment deviation deteriorates the characteristics of the encoder. In addition, when the scale pitches are finely formed, it is difficult to fabricate a light receiving device array corresponding to the scale pitch.

SUMMARY OF THE INVENTION

An object of the present invention is to provide a reflection-type optical encoder using a modified three-grating system in which a light receiving device array is used for serving as a light receiving side index scale, that has a high resolution without need to perform difficult gap adjustments and alignment adjustments.

According to a first aspect of the present invention, an optical encode comprises a first member having a main scale on which reflecting portions and non-reflecting portions are alternately arranged to form a reflection-type grating; a second member disposed opposite to the first member with a predetermined gap so as to be relatively movable; a light emitting device disposed on the second member for irradiating the main scale and generating a reflected image pattern, the light emitting device having a primary light source which generates a diffused light, and an index scale on which light transmitting portions and non-light transmitting portions are alternately arranged to form a transmission-type grating, the index scale serving as a secondary light source array; and a light receiving device array disposed on the second member for detecting the reflected image pattern to generate a plurality of output signals that are 90° phase-shifted from each other, the light receiving device array having a semiconductor substrate and a plurality of light detecting devices formed thereon, the light receiving device array and the index scale being integrally united in such a manner that a receiving surface of the light receiving device array is aligned with a grating surface of the index scale.

According to a second aspect of the present invention, an optical encoder comprises a first member having a main scale on which reflecting portions and non-reflecting portions are alternately arranged to form a reflection-type grating; a second member disposed opposite to the first member with a predetermined gap so as to be relatively movable; a light emitting device disposed on the second member for irradiating the main scale and generating a reflected image pattern, the light emitting device having a primary light source which generates a diffused light, and a plurality of index scales on which light transmitting portions and non-light transmitting portions are alternately arranged to form a transmission-type grating, the index scale serving as a secondary light source array; and a light receiving device array disposed on the second member for detecting the reflected image pattern to generate a plurality of output signals that are 90° phase-shifted from each other, the light receiving device array having a semiconductor substrate and a plurality of light detecting devices formed thereon, wherein the index scales are disposed in the vicinity of the light receiving device array to be integrally united with the light receiving device array in such a manner that each grating surface of the transmission-type gratings is aligned with a receiving surface of the detector array.

The optical encoder according to the present invention is a reflection-type encoder using a modified three-grating system. The light receiving device array that also functions as the light receiving side index scale is integrated with the light source index scale. Thus, when these parts are mounted, alignment adjustments are not required. Consequently, the encoder has excellent characteristics. Unlike with the structure using the light receiving index scale, displacement output signals with two phases or four phases can be obtained within a narrow light receiving surface. Thus, output signals with four phases that are well-balanced can be obtained without an influence of alignment errors of the scales. In addition, no electric adjustments are required.

Moreover, the optical encoder according to the present invention can be applied for such a type that moire fringes are detected. In this case, a moire index scale having an inclined transmission-type grating is disposed on the receiving surface of the light receiving device array. Alternatively, an inclined transmission-type grating is used for the light source index scale. Thus, a high resolution can be obtained without need to finely form pitches of the light receiving device array.

These and other objects, features and advantages of the present invention will become more apparent in light of the following detailed description of best mode embodiments thereof, as illustrated in the accompanying drawings.

BRIEF DESCRIPTION OF DRAWINGS

FIG. 13 is a perspective view showing the structure of a photodiode array according to the embodiment shown in FIG. 11;

FIG. 16 is a perspective view showing the structure of principal portions of an optical encoder according to another embodiment;

FIG. 17 is a plan view showing the structure of principal portions of the optical encoder according to the embodiment shown in FIG. 16;

DETAILED DESCRIPTION OF THE PREFERRED EMBODIMENTS

Next, with reference to the accompanying drawings, embodiments of the present invention will be described.

Figure 1:
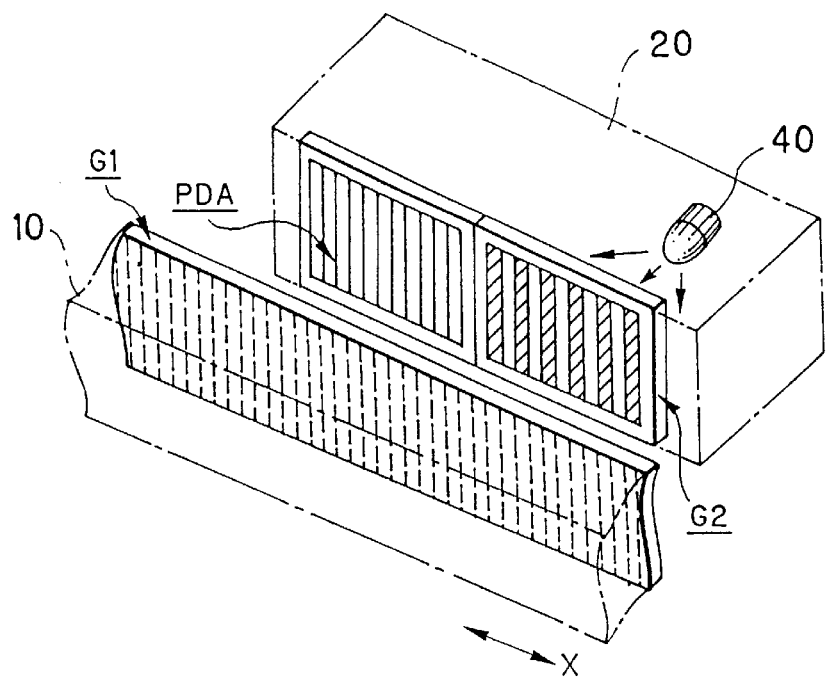
FIG. 1 is a perspective view showing the structure of an optical encoder according to an embodiment of the present invention.
Figure 2:
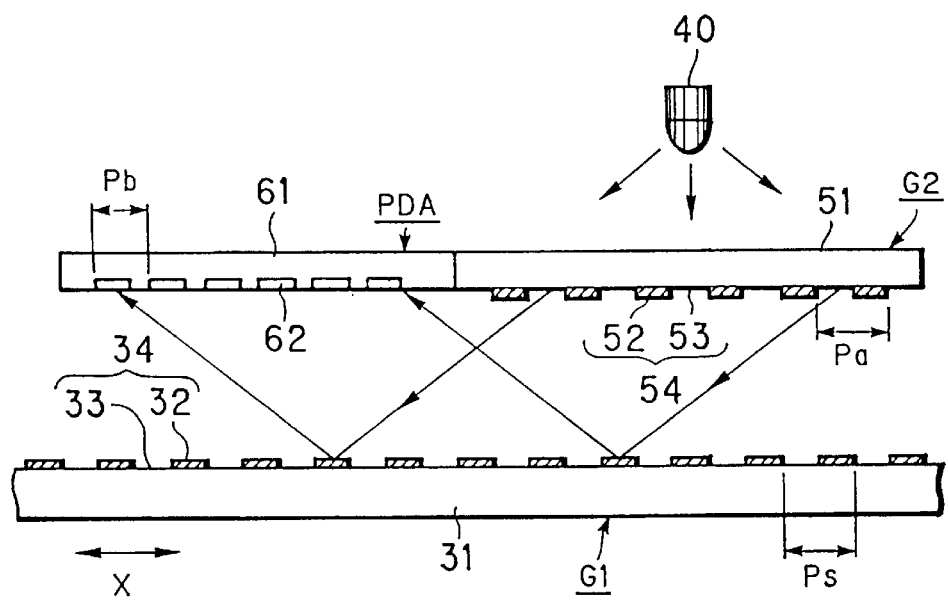
FIG. 2 is a plan view showing the structure of principal portions of the encoder according to the embodiment.

FIG. 1 is a perspective view showing the structure of an optical encoder according to an embodiment of the present invention. FIG. 2 is a plan view showing the structure of principal portions of the encoder shown in FIG. 1. A first member 10 and a second member 20 are disposed with a predetermined gap so as to be relatively movable as denoted by an arrow x. A reflection-type main scale G1 is disposed on the first member 10 so that the main scale G1 faces the second member 20. The main scale G1 is composed of a substrate 31, and light reflecting portions 32 and light non-reflecting portions 33 (light non-transmitting portions or light non-absorbing portions) formed on the substrate 31. The light reflecting portions 32 composed of an Al film or the like and the light non-reflecting portions 33 are alternately arranged at a predetermined pitch Ps to form a reflection-type grating 34.

An LED 40, an index scale G2, and a photodiode array PDA are disposed on the second member 20 so that they face the first member 10. The LED 40 is a primary light source which generates diffused light for irradiating the main scale G1. The index scale G2 receives diffused light from the LED 40 and structures a secondary light source array.

The photodiode array PDA receives a reflected image pattern from the main scale G1. The index scale G2 is composed of a transparent substrate 51, and light non-transmitting portions 52 and light transmitting portions 53 formed on a surface facing the main scale G1 of the substrate 51. The light non-transmitting portions 52 is composed of a Cr film or the like. The light non-transmitting portions 52 and the light transmitting portions 53 are alternately arranged at a predetermined pitch Pa to form a transmission-type grating 54. The photodiode array PDA is composed of an n-type silicon substrate 61 and photodiodes 62 of which a p-type layer is diffused in the substrate 61. The photodiodes 62 are arranged at a predetermined pitch Pb.

In this embodiment, the thickness of the silicon substrate 61 of the photodiode array PDA is the same as the thickness of the transparent substrate 51 of the index scale G2. The side surfaces of the silicon substrate 61 and the transparent substrate 51 are jointed, whereby the index scale G2 and the photodiode array PDA are integrally united and mounted on the second member 20. As a result, a receiving surface of the photodiode array PDA and a grating surface of the index grating G2 are aligned with each other in a plane.

When a geometric optical image pattern on the photodiode array PDA is detected, the pitch Ps of the main scale G1 and the pitch Pa of the index scale G2 are set so that the relation of Pa=2n×Ps (where n is a positive integer) is satisfied. When a diffracted image pattern is detected, the pitches Ps and Pa are set so that the relation of Pa=n×Ps is satisfied.

Figure 3:
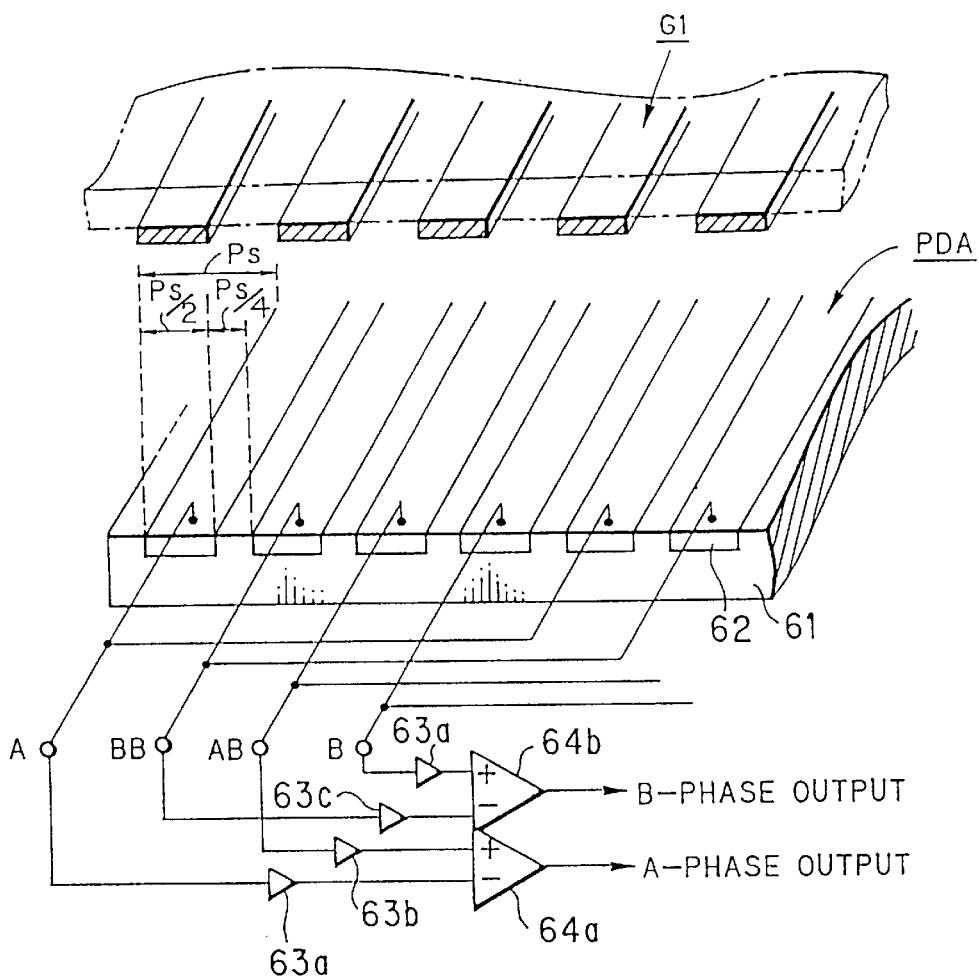
FIG. 3 is a schematic diagram showing the relation of a main scale and a photodiode array according to the embodiment.
Figure 4:
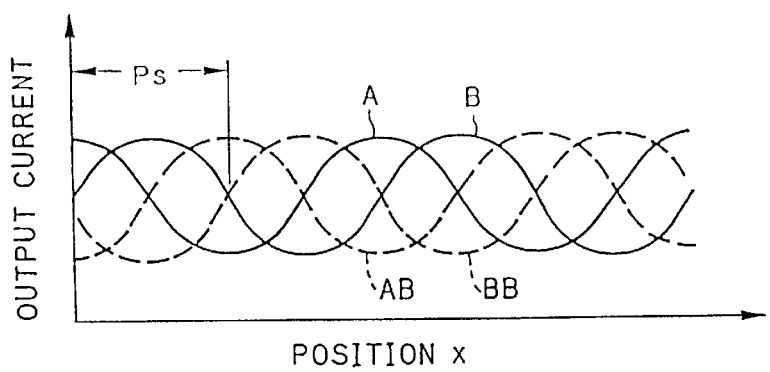
FIG. 4 is a graph showing an output current characteristic of the encoder according to the embodiment.

As shown in FIG. 3, the width of each photodiode 62 is set to Ps/2 and the interval thereof is set to Ps/4, whereby the relation between the pitch Ps of the main scale G1 and the pitch Pb of the photodiode array PDA is set so that the relation of Pb=3Ps/4 is satisfied. Thus, the photodiode array PDA outputs four phase signal currents A, BB, AB, and B, corresponding to the scale displacement x as shown in FIG. 4. The signal currents A, BB, AB and B are 90° phase-shifted in order.

The output currents with the four phases are converted into voltages by current-voltage converters 63a to 63d. Differential amplifiers 64a and 64b obtain the difference between the output currents with the phases A and AB that differ by 180° and the difference between the output currents with the phases B and BB that differ by 180°. Thus, two displacement signals with phases A and B that differ by 90° are obtained. By processing these displacement signals in a known method, a scale displacement can be obtained.

According to the embodiment, without need to use an index scale on the light receiving portion, a reflection-type optical encoder substantially using a three-grating system can be obtained. In addition, since the thickness of the substrate of the photodiode array PDA is the same as the thickness of the substrate of the index scale G2 and they are integrally connected, an alignment error such as a relative skew does not take place unlike the structure that they are separately disposed.

If a light receiving index scale is used, two grating portions that are spaced apart are required for outputting displacement signals with two phases. Likewise, four grating portions that are spaced apart are required for outputting displacement signals with four phases. However, in the system according to the embodiment, the photodiode array PDA output signals with four phases within a narrow light receiving surface. Thus, the influence of an unbalanced distribution of the light amount and the influence of alignment errors of the scales are small.

In addition, as disclosed in Japanese Utility Model Registration Examined Publication 7-888, when a light source index scale and a light receiving index scale are formed on a common substrate, and a light source and light receiving devices are disposed on the same side of these index scales, a diffused light component that is directly reflected by the index scale and input to the light receiving devices cannot be ignored. Since the diffusion light component is superimposed with the output signal, the encoder is adversely affected. According to the embodiment, since the grating surface of the index scale G2 and the receiving surface of the photodiode array PDA are aligned with each other, the diffused light component of the index scale G2 does not directly leak to the photodiode array PDA. G1. Thus, the S/N ratio of the output signal improves.

Figure 5:
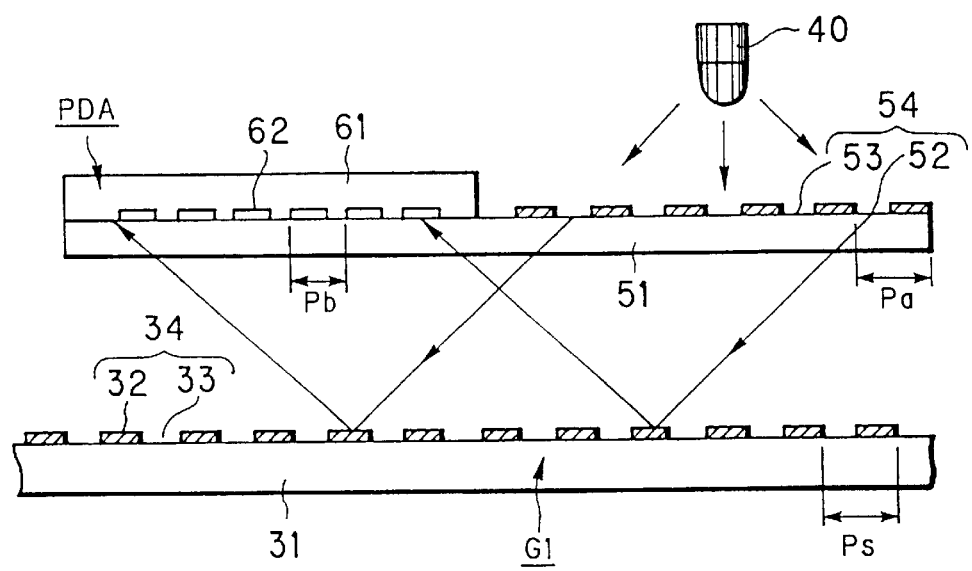
FIG. 5 is a plan view showing the structure of principal portions of an optical encoder according to another embodiment.

FIG. 5 is a perspective view showing the structure of principal portions of an optical encoder according to another embodiment of the present invention. For simplicity, in FIG. 5, similar portions to those in FIG. 2 are denoted by similar reference numerals. In this embodiment, the transmission-type grating 54 of the index scale G2 is formed on a surface facing the light source 40 of the transparent substrate 51. The photodiode array PDA is face down bonded at a position adjacent to the index grating 54 of the transparent substrate 51. In other words, the transparent substrate 51 is used as a common substrate. With the transparent substrate 51, the index scale G2 and the photodiode array PDA are integrally structured.

According to the embodiment shown in FIG. 5, the index scale G2 and the photodiode array PDA are more easily integrated than the embodiment shown in FIG. 1 of which the side surfaces of the PDA and the scale G2 are connected.

Figure 6:
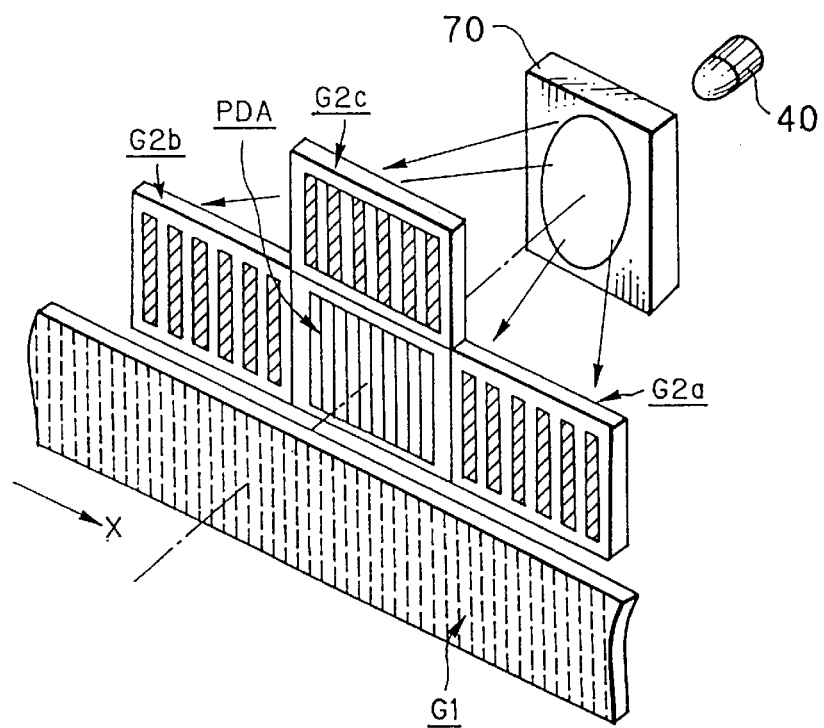
FIG. 6 is a perspective view showing the structure of principal portions of an optical encoder according to another embodiment.

FIG. 6 is a perspective view showing the structure of an optical encoder according to another embodiment. This embodiment is a modification of the embodiment shown in FIG. 1. In the embodiment shown in FIG. 6, first and second index scales G2a and G2b are disposed on both sides of the photodiode array PDA. In addition, a third index scale G2c is disposed at an upper portion of the photodiode array PDA. Diffused light emitted from the light source 40 is further diffused by a lens 70 and radiated to the index scales G2a to G2c. In this case, the thickness of the substrate of each of the index scales G2a to G2c is the same as the thickness of the substrate of the photodiode array PDA. The side surfaces of the index scales G2a to G2c and the photodiode array PDA are integrally connected.

According to the embodiment shown in FIG. 6, since three reflected image patterns of the main scale G1 are projected to the light receiving surface of the photodiode array PDA, the distribution of the light amount on the photodiode array PDA becomes equal.

Figure 7:
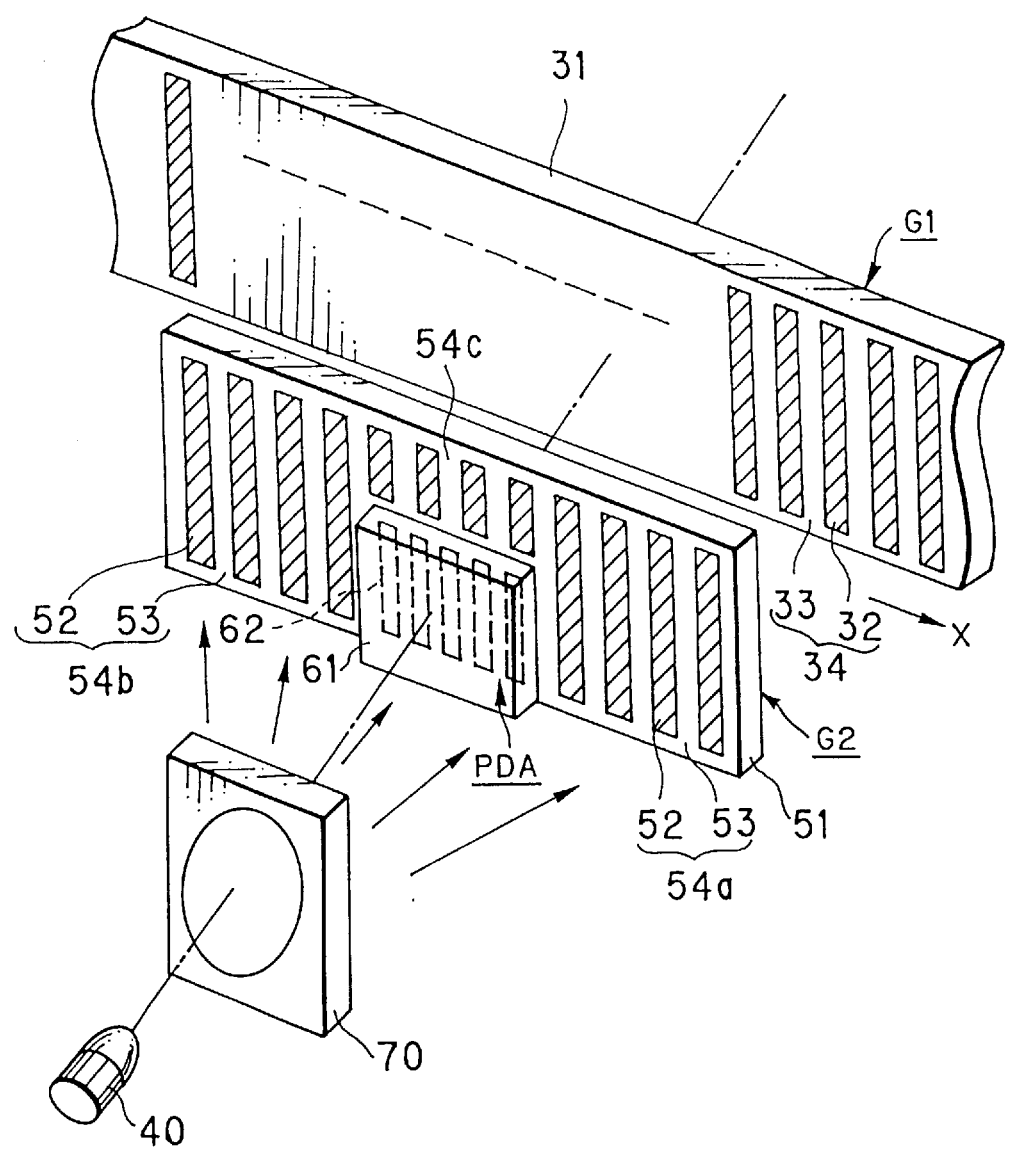
FIG. 7 is a perspective view showing the structure of principal portions of an optical encoder according to another embodiment.

FIG. 7 is a perspective view showing the structure of an encoder according to another embodiment of the present invention. In this embodiment, the substantially same structure as that shown in FIG. 6 is accomplished by use of the structure method shown in FIG. 5. The photodiode array PDA is disposed at a center portion in the relative displacement direction of the index scale G2 so as to be face down bonded on the grating surface of the transparent substrate 51. The transmission-type grating 54 of the index scale G2 is disposed in the periphery of the photodiode array PDA. Two grating portions 54a and 54b are symmetrically disposed on both sides of the photodiode array PDA, and the remaining grating portion 54c is disposed at the upper region of the photodiode array PDA.

According to this embodiment, with one substrate for the index scale, the substantially same structure as that shown in FIG. 6 can be obtained. Thus, the scales can be easily aligned.

Figure 8:
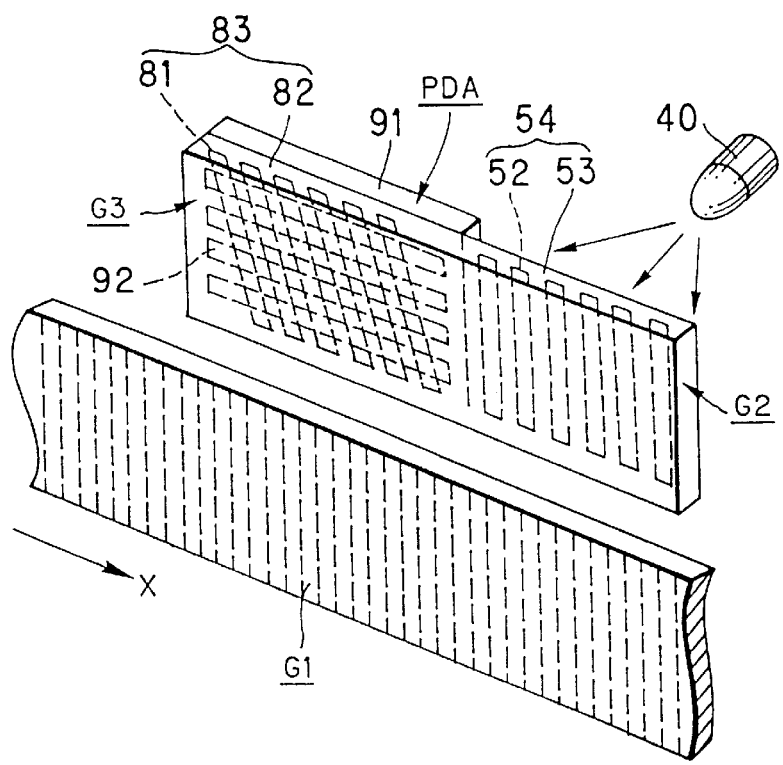
FIG. 8 is a perspective view showing the structure of principal portions of an optical encoder according to another embodiment.
Figure 9:
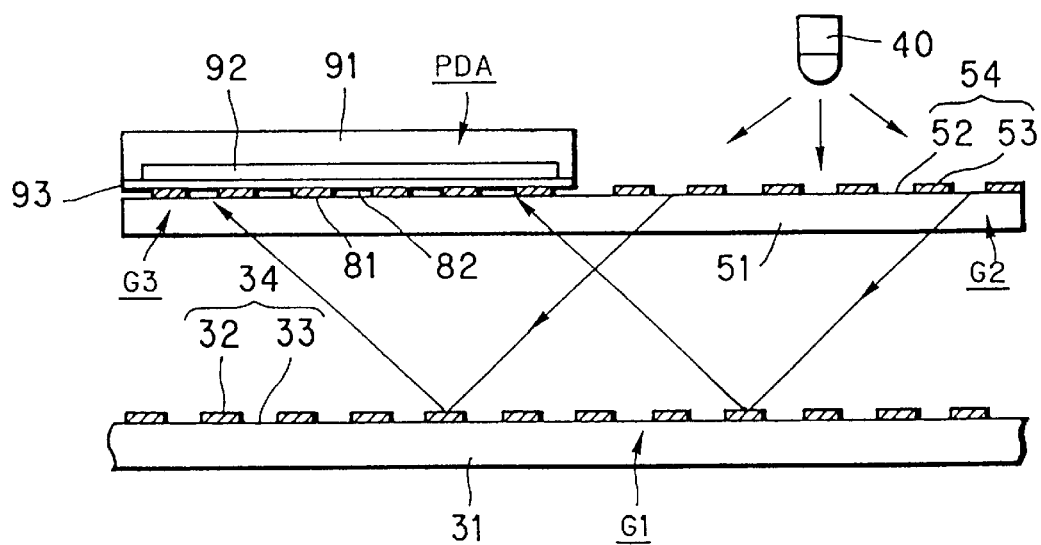
FIG. 9 is a plan view showing the structure of the principal portions of the optical encoder according to the embodiment shown in FIG. 8.

FIG. 8 is a perspective view showing the structure of principal portions of an optical encoder according to another embodiment of the present invention. In the embodiment shown in FIG. 8, a moire fringe pattern is obtained. FIG. 9 is a plan view of FIG. 8. The main scale G1, the index scale G2, and the light source 40 of the embodiment shown in FIG. 8 are the same as those shown in FIG. 5. In the embodiment shown in FIG. 8, the index scale G2 is formed on the transparent substrate 51 such that the transmission-type grating 54 faces the LIGHT SOURCE 40. A moire index scale G3 is disposed at a position adjacent to the index scale G2 on the transparent substrate 51 so as to generate moire fringes with the main scale G1. The moire index scale G3 has an inclined transmission-type grating 83 composed of light transmitting portions 82 and light non-transmitting portions 81 which are alternately arranged. The light transmitting portions 82 and the light non-transmitting portions 81 are formed on the transparent substrate 51 at the same step of forming the transmission-type grating 54 of the index scale G2. The light transmitting portions 82 and the light non-transmitting portions 81 are patterned to have a grating direction slightly inclined from that of the main scale G1 with a predetermined angle.

The photodiode array PDA is face down bonded on a grating surface of the moire index scale G3 in such a manner that the light receiving surface of the photodiode array PDA faces the main scale G1 through the moire index scale G3. The photodiode array PDA is composed by forming p-type photodiodes 92 on the n-type silicon substrate 91. However, in this embodiment, the photodiodes 92 are arranged in a direction of the periods of the moire fringes for detecting the moire fringes.

Figure 10:
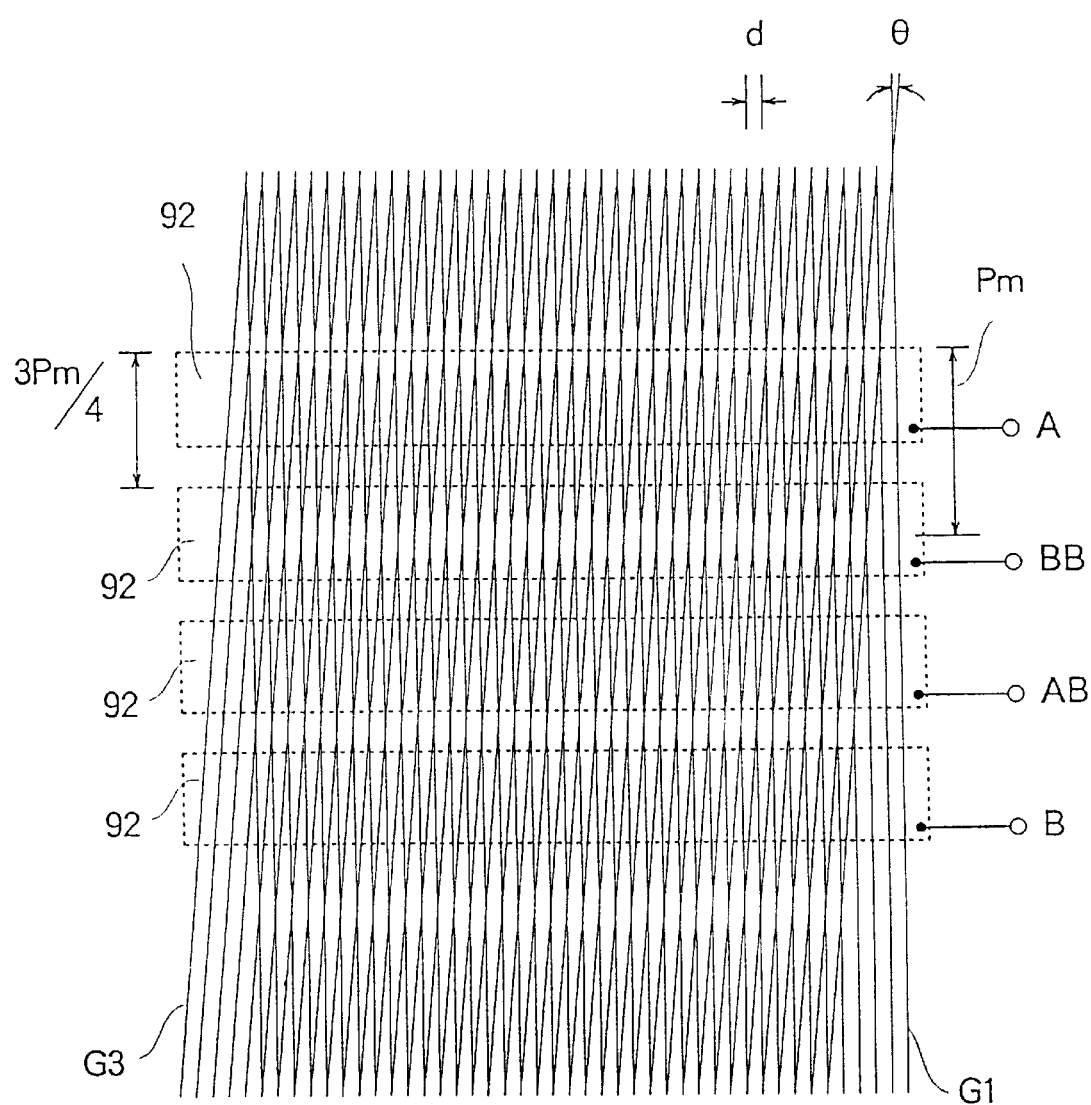
FIG. 10 is a schematic diagram showing the relation between moire fringes and a photodiode array according to the embodiment shown in FIG. 8.

FIG. 10 is a schematic diagram showing the relation between the moire fringes formed by the main scale G1 and the moire index scale G3 and the photodiode array PDA. As shown in FIG. 10, moire fringes are obtained corresponding to the pitches d of the gratings and the inclined angle θ thereof. When the photodiodes 92 are arranged at a pitch 3Pm/4 (where Pm is one period of the moire fringes), corresponding to the displacement of the moire fringes (namely, corresponding to the displacement of the scale), four phase displacement signals A, BB, AB, and B can be obtained.

According to this embodiment, even if the scale pitches are finely formed, the scale pitches can be substantially increased due to moire fringes. Thus, the photodiode array PDA can be easily fabricated. For example, when the grating pitch Ps of the main scale G1, the grating pitch Pa of the index scale G2, and the grating pitch Pb of the moire index scale G3 are set to be in a condition of Ps=Pa=Pb=8 µm (=d), and θ=23.074°, the photodiode array PDA can be disposed with a diode width of 10 µm and pitch of 15 µm.

Figure 11:
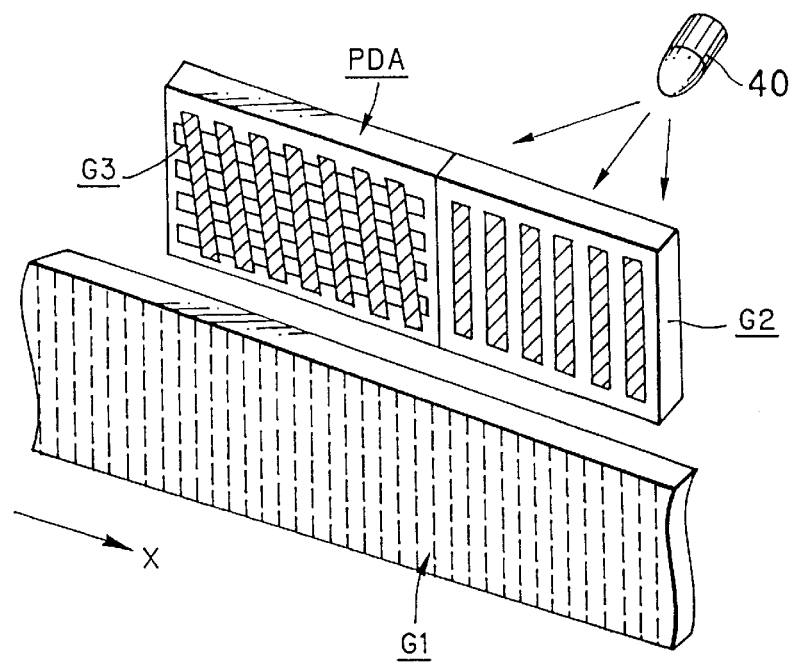
FIG. 11 is a perspective view showing the structure of principal portions of an optical encoder according to another embodiment.
Figure 12:
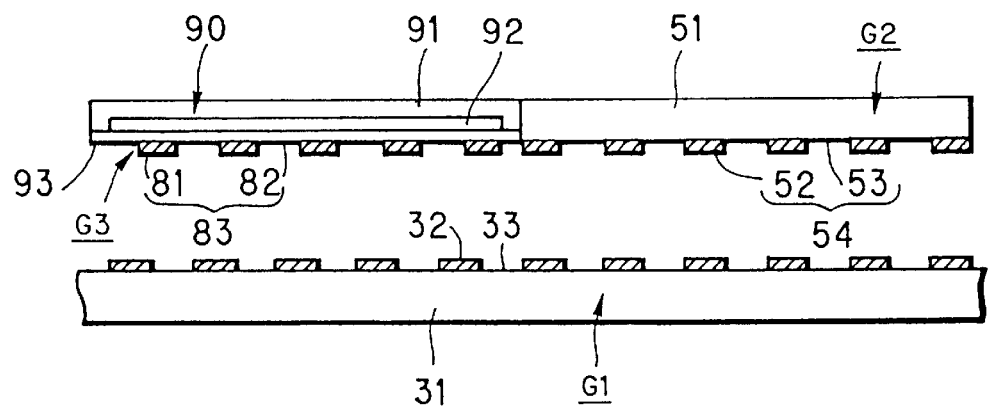
FIG. 12 is a plan view showing the structure of principal portions of the optical encoder according to another embodiment shown in FIG. 11.

FIGS. 11 and 12 are a perspective view and a plan view showing the structure of a modification of the structure shown in FIGS. 8 and 9, respectively. In this embodiment, the inclined transmission-type grating 83 of the moire index scale G3 is formed on the light receiving surface of the photodiode array PDA, separately from the index scale G2. The light non-transmitting portions 81 and light transmitting portions 82 are formed by evaporating and patterning a metal film on the light receiving surface of the photodiode array PDA. FIG. 13 is an enlarged perspective view of FIG. 11. The light receiving surface of the photodiode array PDA is coated with an insulation film 93 such as $SiO_2$. The moire index scale G3 is patterned on the insulation film 93.

As similar to the embodiment shown in FIG. 1, the thickness of the transparent substrate 51 of the index scale G2 is the same as the thickness of the silicon substrate 91 of the photodiode array PDA, and the side surfaces of the transparent substrate 51 and the silicon substrate 91 are integrally connected such that the receiving surface of the photodiode array PDA and the grating surface of the index scale G2 are aligned in a plane.

The photodiode array PDA integrated with the moire index scale G3 may be disposed on the substrate of the light source index scale G2 as with the structure of the embodiment shown in FIG. 8 so that the photodiode array PDA is integrated with the index scale G2.

Figure 14:
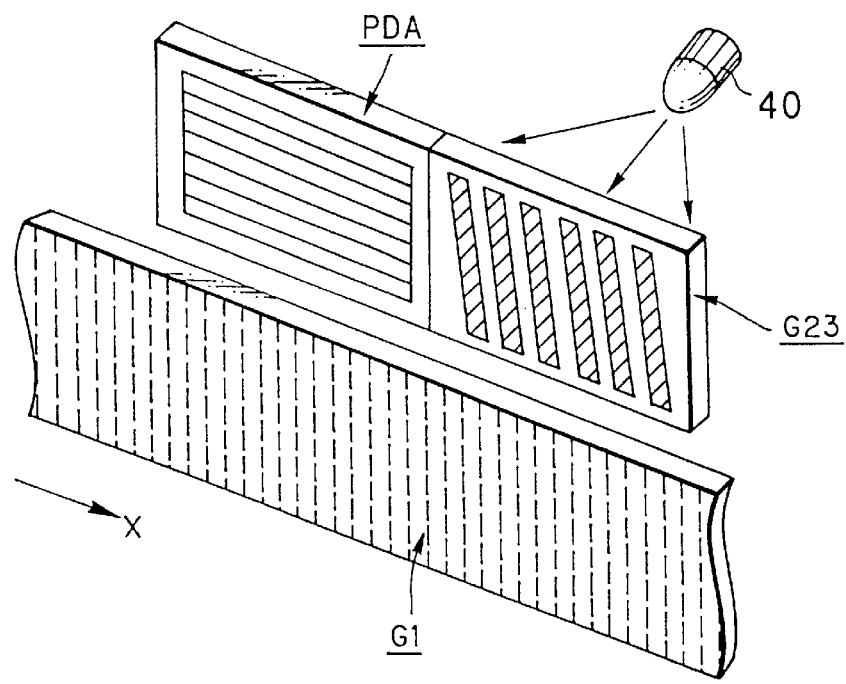
FIG. 14 is a perspective view showing the structure of principal portions of an optical encoder according to another embodiment.
Figure 15:
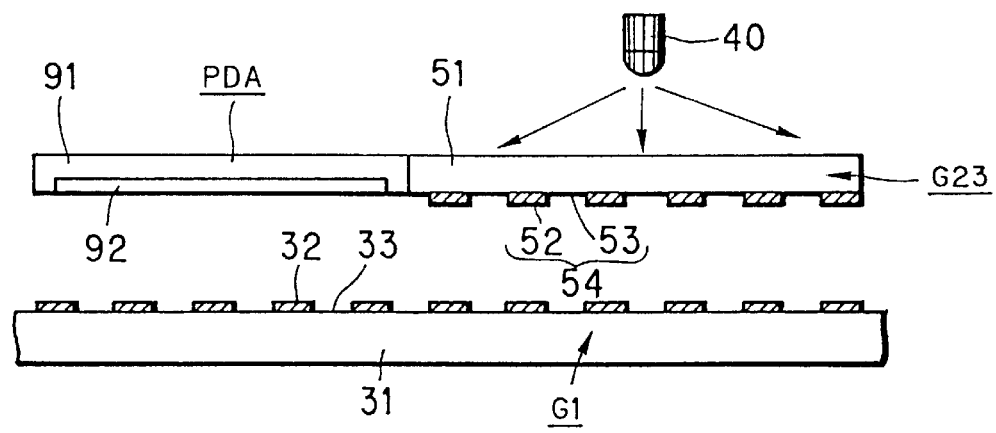
FIG. 15 is a plan view showing the structure of principal portions of the optical encoder according to the embodiment shown in FIG. 14.
Figure 18:
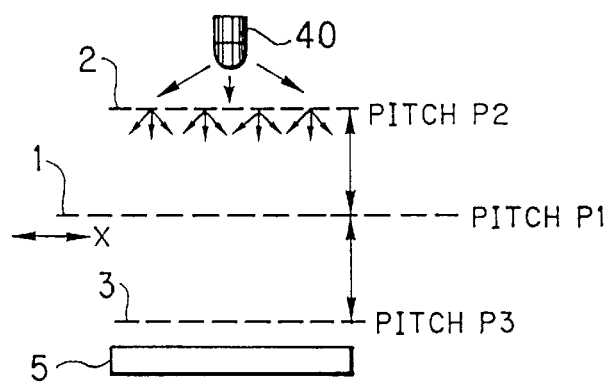
FIG. 18 is a schematic diagram showing the structure of a transmission-type optical encoder using a three-grating system.
Figure 19:
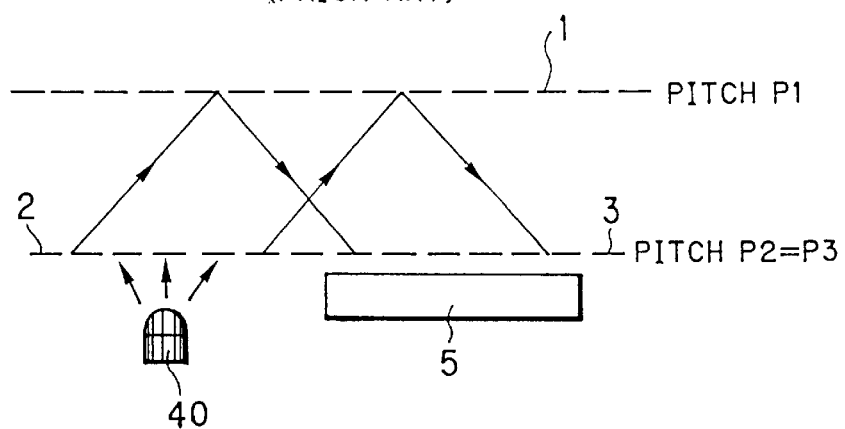
FIG. 19 is a schematic diagram showing the structure of a reflection-type optical encoder using a three-grating system.
Figure 20A:
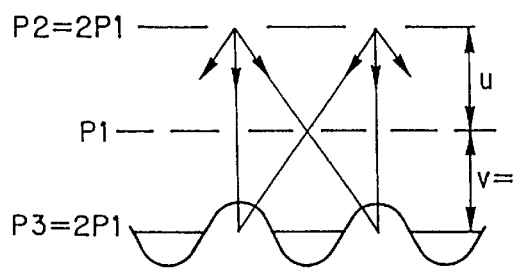
FIGS. 20A and 20B are schematic diagrams showing the theory of forming a bright/dark image pattern of the three-grating system.
Figure 20B:
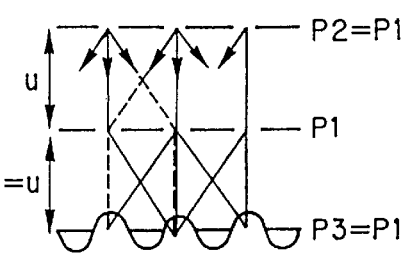

FIGS. 14 and 15 are a perspective view and a plan view showing principal portions of a reflection type encoder using a moire method according to another embodiment of the present invention, respectively. In this embodiment, a transmission-type index scale G23 for moire fringes is disposed on the light source side. The index scale G23 is obtained by inclining the transmission-type grating 54 for the secondary light source array. The thickness of the substrate of the photodiode array PDA is the same as the thickness of the substrate of the index scale G23. As with the structure of the embodiment shown in FIG. 1, the side surfaces of the substrates are integrally connected. In other words, the index scale G3 for moire fringes and the light source side index scale G2 are commonly structured and disposed on the light source side. In this system, moire fringes are generated between the gratings of the index scale G23 and the main scale G1. Thus, the light receiving area of the photodiode array PDA can be advantageously increased.

FIGS. 16 and 17 are a perspective view and a plan view showing principal portions of a reflection-type encoder for moire fringes according to another embodiment of the present invention, respectively. The moire index scale G23 has the inclined transmission-type grating 54 formed on a surface facing the light source 40 of the transparent substrate 51. The moire index scale G23 has an inclined grating transmission-type grating 54 composed of light transmitting portions 53 and light non-transmitting portions 52. The photodiode array PDA is disposed at a position adjacent to the index scale G23 on the transparent substrate 51 in such a manner that a light receiving surface of the photodiode array PDA faces the main scale G1 through the transparent substrate 51.

According to this embodiment, the same effect as the above-described embodiments can be obtained.

In the embodiments shown in FIGS. 14 to 17, the grating of the light source side index scale G23 is inclined against the grating of the main scale G1. Since this inclination is relative, when the light source side index scale is perpendicular to the displacement direction of the scale and the grating the main scale G1 is slightly inclined against the direction perpendicular to the displacement direction of the scale, moire fringes can be obtained.

The present invention is not limited to the above-described embodiments. For example, in the above-described embodiments, the light source index scale and the photodiode array are separately formed, then they are integrally connected. Instead, by depositing a semiconductor film such as an amorphous silicon on the substrate of the index scale, the photodiode array can be formed of the amorphous silicon. Moreover, instead of the photodiodes, phototransistors can be used.

In addition, the light source index scale and the LED as the diffusion light source can be integrally formed. For example, by evaporating and patterning a metal film on the light emitting surface of the LED with a large light emitting surface, the light source index scale and the LED can be integrally united.

As described above, according to the present invention, in a reflection type encoder using a modified three-grating system, when a light receiving device array that also functions as a light receiving side index scale is integrated with a light source index scale, alignment adjustments between the light receiving device array and the light source index scale can be omitted. Thus, an encoder with a high performance can be accomplished. In addition, unlike with the structure using a light receiving index scale, displacement output signals with two or four phases can be obtained with a narrow light receiving surface. Thus, output signals with four phases that are well balanced can be obtained without deviation of the distribution of light amount and influence of alignment errors. In addition, electric adjustments are not required.

Moreover, according to the present invention, a moire index scale is disposed at the receiving surface side of the light receiving device array so as to generate moire fringes between the light source index scale and the main scale so as to detect moire fringes. Thus, a high resolution can be obtained without need to finely form the pitch of the light receiving device array.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. An optical encoder, comprising:
    a first member having a main scale on which reflecting portions and non-reflecting portions are alternately arranged at a pitch Ps to form a reflection-type grating;
    a second member disposed opposite to said first member with a predetermined gap so as to be relatively movable;
    light emitting means disposed on said second member for irradiating said main scale and generating a reflected image pattern, said light emitting means having a primary light source which generates a diffused light, and an index scale on which light transmitting portions and non-light transmitting portions are alternately arranged to form a transmission-type grating, said index scale serving as a secondary light source array; and
    a light receiving device array disposed on said second member for detecting the reflected image pattern to generate four output signals that are 90° phase-shifted sequentially, said light receiving device array having a semiconductor substrate and a plurality of light detecting devices formed thereon, the width of each light detecting device being set to Ps/2 and the interval thereof being set to Ps/4, said light receiving device array and said index scale being integrally united in such a manner that a receiving surface of said light receiving device array is aligned with a grating surface of said index scale.

2. The optical encoder according to claim 1, wherein said grating surface of said index scale faces said main scale, and said light receiving device array and said index scale are integrally jointed such that the receiving surface and the grating surface are aligned in a plane.

3. The optical encoder according to claim 2, wherein
    said light receiving device array has the same thickness as said index scale.

4. The optical encoder according to claim 1, wherein
    said index scale comprises a transparent substrate and said transmission-type grating formed on a surface of said transparent substrate facing said primary light source, and
    said light receiving device array is face down bonded at a position adjacent to said transmission-type grating on said transparent substrate.

5. The optical encoder according to claim 4, wherein
    said light receiving device array is face down bonded at a center portion in the relative displacement direction of said index scale, and
    said transmission-type grating has at least two grating portions symmetrically disposed on both sides of said light receiving device array.

6. An optical encoder, comprising:
    a first member having a main scale on which reflecting portions and non-reflecting portions are alternately arranged at a pitch Ps to form a reflection-type grating;
    a second member disposed opposite to said first member with a predetermined gap so as to be relatively movable;
    light emitting means disposed on said second member for irradiating said main scale and generating a reflected image pattern, said light emitting means having a primary light source which generates a diffused light, and an index scale on which light transmitting portions and non-light transmitting portions are alternately arranged to form a transmission-type grating, said index scale serving as a secondary light source array; and
    a light receiving device array disposed on said second member for detecting the reflected image pattern to generate four output signals that are 90° phase-shifted sequentially, said light receiving device array having a semiconductor substrate and a plurality of light detecting devices formed thereon, the width of each light detecting device being set to Ps/2 and the interval thereof being set to Ps/4, wherein
    said index scales are disposed in the vicinity of said light receiving device array to be integrally united with said light receiving device array in such a manner that each grating surface of said transmission-type gratings is aligned with a receiving surface of said light receiving device array.

7. The optical encoder according to claim 6, wherein said light receiving device array has the same thickness as said index scale.

8. The optical encoder according to claim 1, further comprising:

a moire index scale having an inclined transmission-type grating disposed on a receiving surface side of said light receiving device array for generating moire fringes with said main scale, said inclined transmission-type grating having transmitting portions and non-transmitting portions alternately arranged so as to have a grating direction inclined from that of said main scale with a predetermined angle, wherein said light receiving device array has a plurality of light detecting devices arranged in a direction of periods of said moire fringes for detecting said moire fringes.

9. The optical encoder according to claim 8, wherein said index scale comprises a transparent substrate and said transmission-type grating formed thereon;

said inclined transmission-type grating of said moire index scale is disposed at a position adjacent to said transmission-type grating on said transparent substrate; and said light receiving device array is face down bonded on said inclined transmission-type grating of said transparent substrate.

10. The optical encoder according to claim 8, wherein said grating surface of said index scale faces said main scale;

said light receiving device array and said index scale are integrally jointed such that the receiving surface and the grating surface are aligned in a plane; and said inclined transmission-type grating is patterned on the receiving surface of said light receiving device array.

11. The optical encoder according to claim 1, wherein said transmission-type grating of said index scale is formed to have a grating direction inclined from that of said main scale with a predetermined angle so as to serve as a moire index scale for generating moire fringes with said main scale, and said light receiving device array has a plurality of light detecting devices arranged in a direction of periods of said moire fringes for detecting said moire fringes.

12. The optical encoder according to claim 11, wherein said grating surface of said index scale faces said main scale, and said light receiving device array and said index scale are integrally jointed such that the receiving surface and the grating surface are aligned in a plane.

13. The optical encoder according to claim 11, wherein said index scale comprises a transparent substrate and said transmission-type grating formed on a surface of said transparent substrate facing said primary light source, and said light receiving device array is face down bonded at a position adjacent to said transmission-type grating on said transparent substrate.

* * * * *